United States Patent
Chen

(10) Patent No.: US 9,123,557 B2
(45) Date of Patent: Sep. 1, 2015

(54) FAST RECOVERY RECTIFIER

(71) Applicant: SUMPRO ELECTRONICS CORPORATION, Taoyuan County (TW)

(72) Inventor: Wei-Fan Chen, Taoyuan County (TW)

(73) Assignee: SUMPRO ELECTRONICS CORPORATION, Taoyuan (TW)

( * ) Notice: Subject to any disclaimer, the term of this patent is extended or adjusted under 35 U.S.C. 154(b) by 40 days.

(21) Appl. No.: 14/074,729

(22) Filed: Nov. 8, 2013

(65) Prior Publication Data

US 2015/0130014 A1 May 14, 2015

(51) Int. Cl.
*H01L 29/06* (2006.01)
*H01L 29/73* (2006.01)

(52) U.S. Cl.
CPC ............ *H01L 29/0688* (2013.01); *H01L 29/73* (2013.01)

(58) Field of Classification Search
CPC ....... H01L 29/32; H01L 29/36; H01L 29/861; H01L 29/872
USPC .......................................... 257/495, E21.358
See application file for complete search history.

(56) References Cited

U.S. PATENT DOCUMENTS

| | | | | |
|---|---|---|---|---|
| 3,725,683 | A * | 4/1973 | Andersen | 327/440 |
| 4,300,152 | A * | 11/1981 | Lepselter | 257/376 |
| 4,412,376 | A * | 11/1983 | De Bar et al. | 438/326 |
| 5,557,127 | A * | 9/1996 | Ajit et al. | 257/339 |
| 6,261,874 | B1 | 7/2001 | Francis et al. | |
| 6,261,875 | B1 | 7/2001 | Zhang et al. | |
| 6,486,524 | B1 | 11/2002 | Ahmed | |
| 6,603,153 | B2 | 8/2003 | Francis et al. | |
| 6,743,703 | B2 * | 6/2004 | Rodov et al. | 438/527 |
| 7,880,166 | B2 | 2/2011 | Yu | |
| 8,669,554 | B2 * | 3/2014 | Yu | 257/44 |
| 2011/0241170 | A1 * | 10/2011 | Haeberlen et al. | 257/532 |
| 2012/0104456 | A1 * | 5/2012 | Yu | 257/109 |

* cited by examiner

*Primary Examiner* — Thao P Le
(74) *Attorney, Agent, or Firm* — Jianq Chyun IP Office

(57) ABSTRACT

The present disclosure provides a rectifier. The rectifier includes a N-type epitaxial layer, a plurality of P-type diffusion regions and a plurality of N-type diffusion regions. The P-type diffusion regions are disposed in the N-type epitaxial layer, and the N-type diffusion regions are respectively disposed in the P-type diffusion regions. Wherein, the P-type diffusion regions are electronically coupled to the N-type diffusion regions.

10 Claims, 4 Drawing Sheets

FAST RECOVERY RECTIFIER

BACKGROUND OF THE INVENTION

1. Field of Invention

The present invention generally relates to a rectifier, and more particularly to a rectifier for reducing the reverse recovery time (TRR).

2. Description of Prior Art

Power semiconductor devices including at least partly diode structure such as Fast Recovery Diode (FRD), Metal Oxide Semiconductor Field Effect Transistor (MOSFET) and Insulated Gate Bipolar Transistor (IGBT) are used as switch in a power supply circuit. In order to enable fast switching and reduce switch loss, the power semiconductor devices are require to have the switch with short reverse recovery time (TRR). In conventional art, the TRR can be reduced by using low doped N-type or P-type impurity semiconductor devices to reduce the supply and accumulation of electrons and holes when the power semiconductor device is in the forward bias. On the other hand, the reduction in N-type and P-type impurity causes significantly increase in the contact resistance, and the increasing of the contact resistance impacts the switching performance of the power semiconductor devices. Besides, high concentration of N-type or P-type impurity causes the problem of increasing TRR of the switch.

Especially, when a voltage level of an operation voltage applied on the rectifier is relatively high, the TRR increases seriously, and the performance of the rectifier is reduced.

SUMMARY OF THE INVENTION

The present invention provides a rectifier for reducing the reverse recovery time.

The rectifier includes a N-type epitaxial layer, a plurality of P-type diffusion regions and a plurality of N-type diffusion regions. The P-type diffusion regions are disposed in the N-type epitaxial layer, and the N-type diffusion regions are respectively disposed in the P-type diffusion regions. Wherein, the P-type diffusion regions are electronically coupled to the N-type diffusion regions.

In an embodiment of the disclosure, the rectifier further includes a cover layer. The cover layer covers the N-type epitaxial layer, the P-type diffusion regions and the N-type diffusion regions, and the N-type epitaxial layer, the P-type diffusion regions and the N-type diffusion regions are electrically coupled through the cover layer to be an anode of the rectifier.

In an embodiment of the disclosure, wherein the N-type epitaxial layer forms a cathode of the rectifier.

In an embodiment of the disclosure, wherein the cover layer is a metal layer or a metal silicide layer.

In an embodiment of the disclosure, wherein a distance between two of the neighbored P-type diffusion regions is between a predetermined range.

In an embodiment of the disclosure, the rectifier further includes at least one plurality of first P-type guarding diffusion region. The first P-type guarding diffusion region is disposed in the N-type epitaxial layer and surrounds the P-type diffusion regions, wherein the first P-type guarding diffusion region is floating.

In an embodiment of the disclosure, the rectifier further includes at least one second P-type guarding diffusion region. The second P-type guarding diffusion region is disposed in the N-type epitaxial layer and surrounds the first P-type guarding diffusion region, wherein the second P-type guarding diffusion region is electronically coupled to the N-type diffusion regions.

In an embodiment of the disclosure, the rectifier further includes a silicon oxide layer. The silicon oxide layer is disposed on and covers the first P-type guarding diffusion region and the second P-type guarding diffusion region.

In an embodiment of the disclosure, the rectifier further includes a N-type substrate layer. The N-type epitaxial layer is disposed on the N-type substrate layer, and the N-type epitaxial layer covers the N-type substrate layer.

In an embodiment of the disclosure, wherein the N-type epitaxial layer, each of the P-type diffusion regions and the corresponding N-type diffusion region forms a bipolar transistor.

Accordingly, the present disclosure provides a plurality of N-type diffusion regions being respectively disposed in the P-type diffusion regions to form a plurality of bipolar transistors in the rectifier. Therefore, when the rectifier is in reverse biasing, there is no residue hold charge in silicon of the rectifier. The reverse recovery time can be reduced even the rectifier is working in a high operating voltage.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
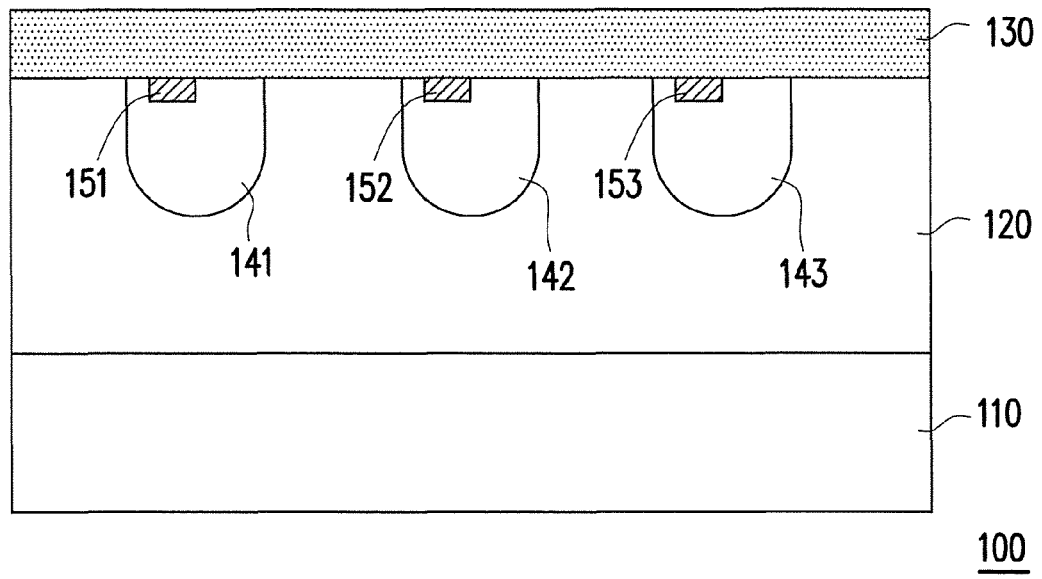
FIG. 1 is a structure diagram of a rectifier according to an embodiment of the present invention.

Reference will now be made in detail to the present preferred embodiment of the invention, examples of which are illustrated in the accompanying drawings. Wherever possible, the same reference numbers are used in the drawings and the description to refer to the same or like parts.

Referring to FIG. 1, FIG. 1 is a structure diagram of a rectifier according to an embodiment of the present invention. The rectifier 100 includes a N-type substrate layer 110, a N-type epitaxial layer 120, a plurality of P-type diffusion regions 141-143, a plurality of N-type diffusion regions 151-153, and a cover layer 130. The N-type epitaxial layer 120 is disposed on the N-type substrate layer 110, and the N-type epitaxial layer 120 covers the N-type substrate layer 110. The P-type diffusion regions 141-143 are disposed in the N-type epitaxial layer 120, and the N-type diffusion regions 151-153 are respectively disposed in the P-type diffusion regions 141-143.

The cover layer 130 is disposed on the N-type epitaxial layer 120, and the cover layer 130 covers the N-type epitaxial layer 120, the P-type diffusion regions 141-143, and the N-type diffusion regions 151-153. In this embodiment, the P-type diffusion regions 141-143 may be respectively coupled to the N-type diffusion regions 151-153 through the cover layer 130, and the P-type diffusion regions 141-143 may be coupled together through the cover layer 130 to form a anode of the rectifier 100.

The cover layer 130 may be a metal layer or a metal silicide layer, and the cover layer 130 may be the metal layer formed by Au, Pt, W, Mo, Cr, Ni, Ti or other metal. Beside, the cover layer 130 may be used to form the silicide, and then followed by the diffusion barrier such as TiW, TiN or other layer before a contact layer is deposited. The contact layer may be formed by Al for wire bonding, or formed by Ag or Au for soldering.

On the other hand, the N-type epitaxial layer 120 may be used to form a cathode of the rectifier 100. That is, a wire may be connected to the cathode of the rectifier 100 by contacting to the N-type epitaxial layer 120 or the N-type substrate layer 110.

An electrode of the cathode of the rectifier 100 can be disposed on the N-type substrate layer 110 and the electrode of the cathode of the rectifier 100 contacts the N-type substrate layer 110. An electrode of the anode of the rectifier 100 can be dispose on the cover layer 130, and the electrode of the anode of the rectifier 100 contacts the cover layer 130 for electronically coupled to the P-type diffusion regions 141-143 and the N-type diffusion regions 151-153.

In addition, each of the P-type diffusion regions 141-143 is not contacted to each other. Further, a distance between two of the neighbored P-type diffusion regions 141-143 is between a predetermined range. The predetermined range may be set by a designer of the rectifier 100, and the predetermined range may be set according to an operating voltage of the rectifier 100 and process parameters of the rectifier 100. Moreover, the number of the P-type diffusion regions is not limited, three P-type diffusion regions 141-143 disposed in the rectifier 100 in FIG. 1 is just an example.

Figure 2:
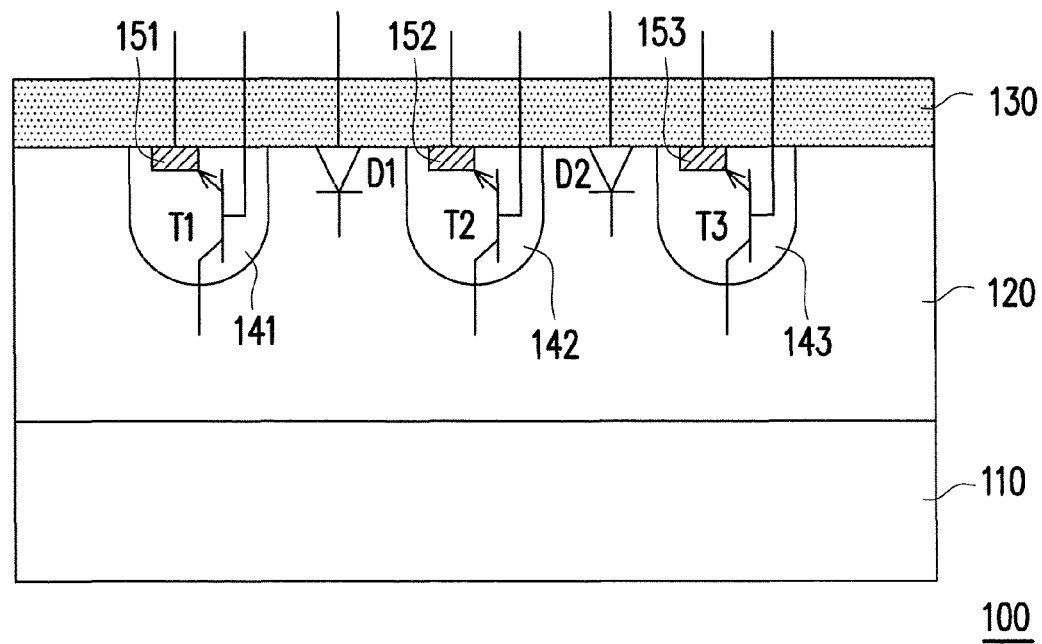
FIG. 2 is an equivalent circuit diagram of the rectifier 100 according to the embodiment of the present invention.

Referring to FIG. 2, FIG. 2 is an equivalent circuit diagram of the rectifier 100 according to the embodiment of the present invention. Please notice here, the N-type epitaxial layer 120, each of the P-type diffusion regions 141-143 and the respectively corresponding N-type diffusion regions 151-153 form bipolar transistors T1-T3. The N-type diffusion regions 151-153 respectively form emitters of the bipolar transistors T1-T3, the P-type diffusion regions 141-143 respectively form bases of the bipolar transistor T1-T3, and the N-type epitaxial layer 120 forms collectors of the bipolar transistors T1-T3. The bipolar transistors T1-T3 are NPN type bipolar transistors, and the emitters of the bipolar transistors T1-T3 are poly emitters. On the other hand, schottky diodes D1 and D2 can be formed by the cover layer 130 and the N-type epitaxial layer 120. The anodes of the schottky diodes D1 and D2 may be coupled to the emitters and bases of the bipolar transistors T1-T3, and the cathodes of the schottky diodes D1 and D2 are coupled to the collectors of the bipolar transistors T1-T3.

Besides, about the emitters of the bipolar transistors T1-T3, shallow junctions are formed by the diffusion from the poly silicon. The poly silicon may be made of by an in-situ doping poly. The carrier concentration of the in-situ doping poly may be from 1E18 to 1E21 of the N-type impurity.

Figure 3A:
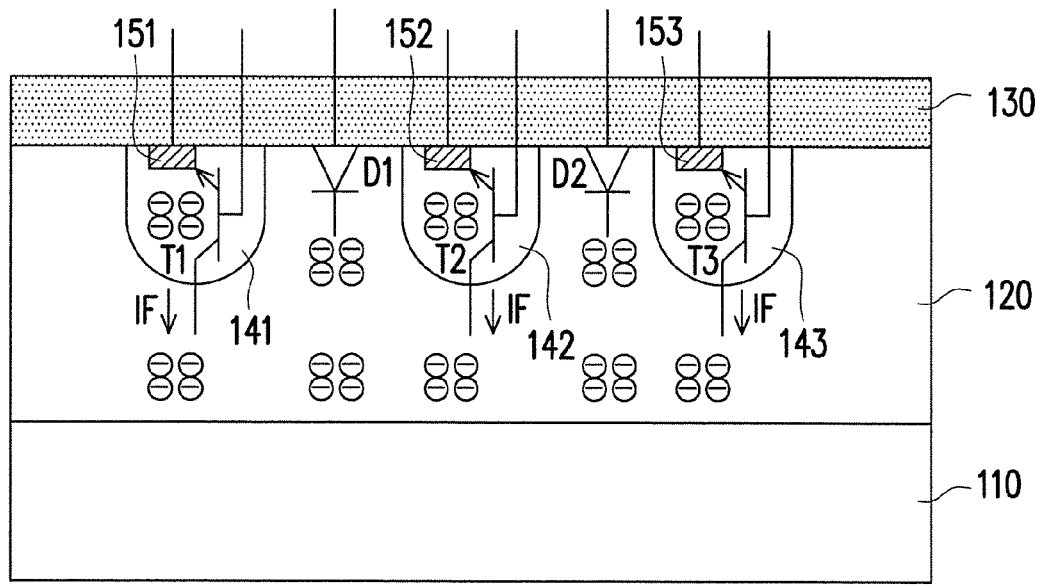
FIG. 3A is a block diagram when the rectifier 100 is in forward bias.
Figure 3B:
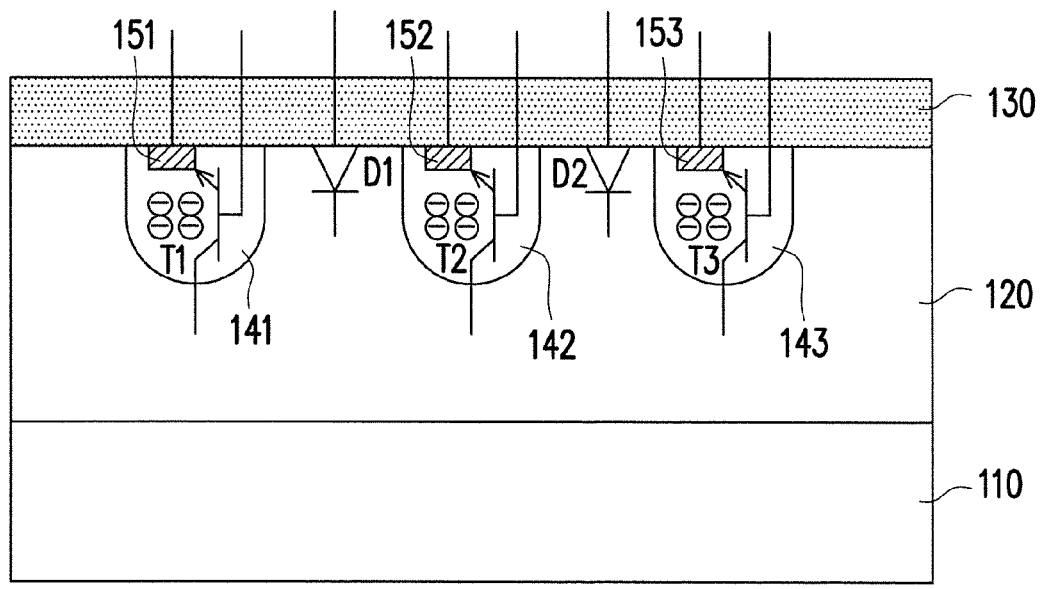
FIG. 3B is a block diagram when the rectifier 100 is in reverse bias.

In operation of the rectifier, referring to FIG. 3A and FIG. 3B, FIG. 3A is a block diagram when the rectifier 100 is in forward bias, and FIG. 3B is a block diagram when the rectifier 100 is in reverse bias. In FIG. 3A, when the rectifier 100 is in forward bias (that is, a first voltage is applied to the anode of the rectifier 100, and a second voltage is applied to the cathode of the rectifier 100, and a voltage level of the first voltage is larger than a voltage level of the second voltage), the currents IF flow from the anode of the rectifier 100 to the N-type epitaxial layer 120 and the N-type substrate layer 110 through current channels formed by the bipolar transistors T1-T3. Because of the depth of the P-N junctions formed by the N-type epitaxial layer 120 and the P-type diffusion regions 141-143 are reduced, the minority carrier density thereof may significantly decreased in the N-type epitaxial layer 120 and the N-type substrate layer 110. Hence, a forward turn-on voltage is reduced and thus the switching speed of the rectifier 100 may be improved.

In FIG. 3B, when the rectifier 100 is in reverse bias (that is, a first voltage is applied to the anode of the rectifier 100, and a second voltage is applied to the cathode of the rectifier 100, and a voltage level of the first voltage is smaller than a voltage level of the second voltage), a depletion layer is formed to extend to the P-type diffusion regions 141-143, and the current channels are closed, such as that the rectifier 100 is turned off. Because of the bipolar transistors T1-T3, there is no residue hole charge in the N-type epitaxial layer 120, and the reverse recovery time (TRR) may be improved.

In summary, referring to FIG. 3A and FIG. 3B, the rectifier 100 provides a shallow junction structure between the P-type diffusion regions 141-143 and the N-type epitaxial layer 120 to lower a built-in potential while the junction structure is used to improve a reverse breakdown voltage and reduce leakage current. In addition, the emitters of the bipolar transistors T1-T3 creates Ohmic contacts between the anode of the rectifier 100 and the semiconductor structure of the rectifier 100. Such as that, majority of current flows through the junction structure of the rectifier 100, and the transient speed as well as the reverse recovery charge (QRR) are further decrease.

Figure 4:
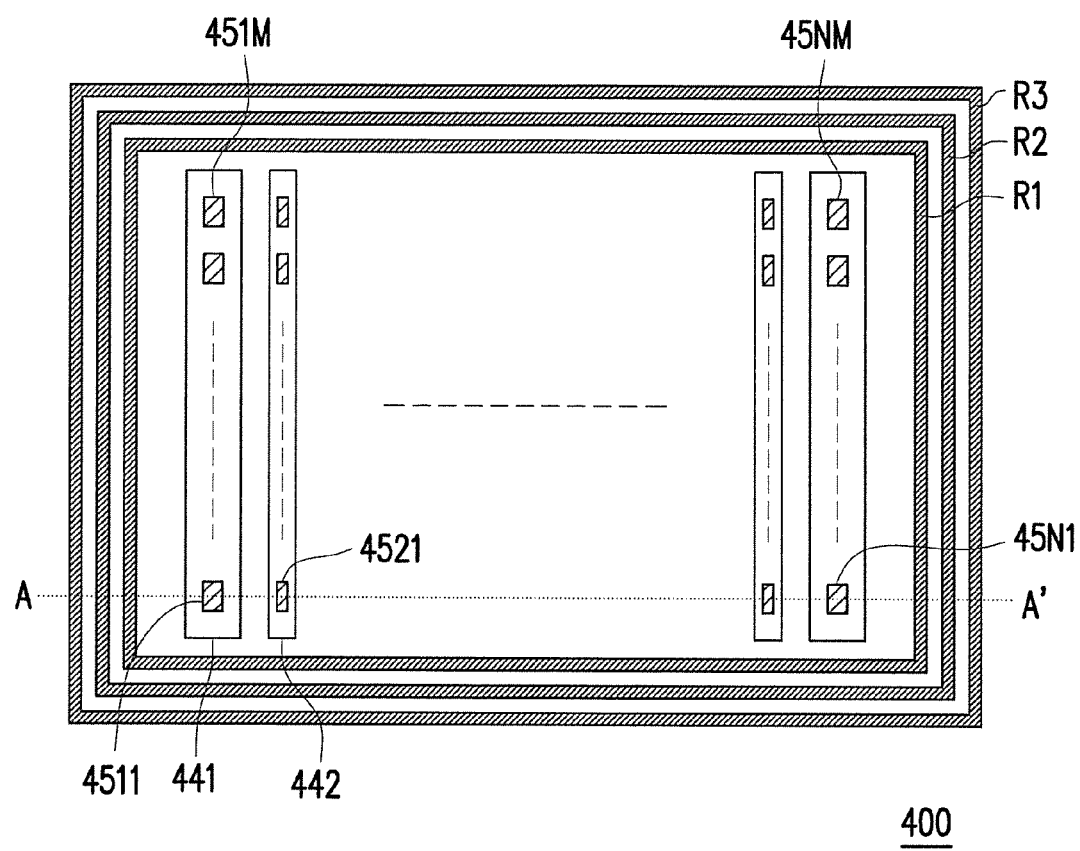
FIG. 4 is a top view of the rectifier according to the embodiment of the present invention.

Referring to FIG. 4, FIG. 4 is a top view of the rectifier according to the embodiment of the present invention. In FIG. 4, the rectifier 400 includes guard rings R1-R3, P-type diffusion regions 441-44N, and N-type diffusion regions 4511-45NM. The N-type diffusion regions 4511-45NM are arranged in an array, and each of the P-type diffusion regions (for example, P-type diffusion region 441) has a plurality of N-type diffusion regions (for example, N-type diffusion regions 4511-451M). The guard rings R1-R3 surround the P-type diffusion regions 441-44N, and areas of the P-type diffusion regions 441 and 44N which neighbor to the guard ring R1 are larger than the other P-type diffusion regions. Areas of the N-type diffusion regions disposed in P-type diffusion regions 441 and 44N may be larger than the N-type diffusion regions disposed out of the P-type diffusion regions 441 and 44N, too.

Figure 5:
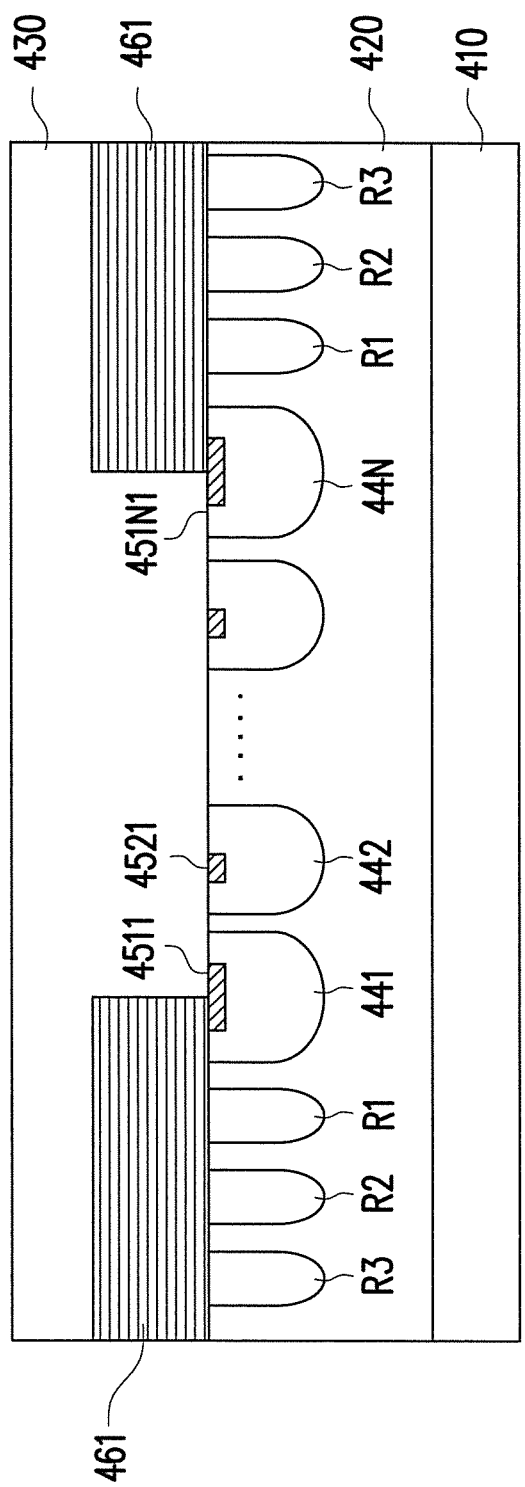
FIG. 5 is a cross section view of the rectifier 400 along a section line A to A' in FIG. 4.

Referring to FIG. 5, FIG. 5 is a cross section view of the rectifier 400 along a section line A to A' in FIG. 4. In FIG. 5, the rectifier 400 includes a N-type substrate layer 410, a N-type epitaxial layer 420, a cover layer 430, P-type diffusion regions 441-44N, N-type diffusion regions 4511-45N1, a silicon oxide layer 461, and P-type guarding diffusion regions R1-R3. The P-type guarding diffusion regions R1-R3 are disposed in the edges of the rectifier 400, and the P-type diffusion regions 441-44N are surrounded by the P-type guarding diffusion regions R1-R3. More specially, the P-type guarding diffusion regions R1 and R2 are electronically floating. The P-type guarding diffusion regions R3 may be coupled to the P-type diffusion regions 441-44N.

The silicon oxide layer 461 is disposed on the N-type epitaxial layer 420, and the silicon oxide layer 461 covers a part of the N-type epitaxial layer 420, all of the P-type guarding diffusion regions R1-R3, a part of the P-type diffusion regions 441 and 44N, and a part of the N-type diffusion regions 4511 and 45N1. The P-type guarding diffusion regions R1-R3 are use to be terminal structures of the rectifier 400 to improve the reverse breakdown voltage and reduce leakage current.

In summary, the present disclosure provides a plurality of P-type diffusion regions disposed in the N-type epitaxial layer to form shallow P-N junction structure. The built-in potential of the rectifier can be lowered. Furthermore, the present disclosure provides a plurality of bipolar transistors by disposing a plurality of N-type diffusion regions in each of the P-type diffusion regions. The hole charge in the N-type epitaxial layer can be eliminated when the rectifier is reverse biased, and the reverse recovery time (TRR) can be reduced. That is, the performance of the rectifier can be improved according to the present disclosure.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A rectifier, comprising:
   a N-type epitaxial layer;
   a plurality of P-type diffusion regions being disposed in the N-type epitaxial layer;
   a plurality of N-type diffusion regions being respectively disposed in the P-type diffusion regions; and
   a cover layer, directly covering the P-type diffusion regions and the N-type diffusion regions,
   wherein the P-type diffusion regions are electronically coupled to the N-type diffusion regions through the cover layer.

2. The rectifier according to claim 1,
   wherein the cover layer further directly covers the N-type epitaxial layer, and the N-type epitaxial layer, the P-type diffusion regions and the N-type diffusion regions being electrically coupled through the cover layer to be an anode of the rectifier.

3. The rectifier according to claim 2, wherein the N-type epitaxial layer forms a cathode of the rectifier.

4. The rectifier according to claim 2, wherein the cover layer is a metal layer or a metal silicide layer.

5. The rectifier according to claim 1, wherein a distance between adjacent two of the P-type diffusion regions is between a predetermined range.

6. The rectifier according to claim 1, further comprising:
   at least one first P-type guarding diffusion region, disposed in the N-type epitaxial layer and surrounding the P-type diffusion regions, wherein the first P-type guarding diffusion region is floating.

7. The rectifier according to claim 6, further comprising:
   at least one second P-type guarding diffusion region, disposed in the N-type epitaxial layer and surrounding the first P-type guarding diffusion region, wherein the second P-type guarding diffusion region is electronically coupled to the N-type diffusion regions.

8. The rectifier according to claim 7, further comprising:
   a silicon oxide layer, disposed on and covering the first P-type guarding diffusion region and the second P-type guarding diffusion region.

9. The rectifier according to claim 1, further comprising:
   a N-type substrate layer, wherein the N-type epitaxial layer is disposed on the N-type substrate layer, and the N-type epitaxial layer covers the N-type substrate layer.

10. The rectifier according to claim 1, wherein the N-type epitaxial layer, each of the P-type diffusion regions and the corresponding N-type diffusion region forms a bipolar transistor.

* * * * *